(12) United States Patent
Fang

(10) Patent No.: US 9,960,374 B1
(45) Date of Patent: May 1, 2018

(54) STRIPPING METHOD OF FLEXIBLE SUBSTRATE

(71) Applicant: Wuhan China Star Optoelectronics Technology Co., Ltd., Wuhan (CN)

(72) Inventor: Hong Fang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 213 days.

(21) Appl. No.: 15/100,317

(22) PCT Filed: May 13, 2016

(86) PCT No.: PCT/CN2016/081968
§ 371 (c)(1),
(2) Date: May 30, 2016

(87) PCT Pub. No.: WO2017/177499
PCT Pub. Date: Oct. 19, 2017

(30) Foreign Application Priority Data

Apr. 12, 2016 (CN) .......................... 2016 1 0225895

(51) Int. Cl.
| | |
|---|---|
| *H01L 21/311* | (2006.01) |
| *H01L 51/00* | (2006.01) |
| *H01L 21/683* | (2006.01) |
| *H01L 51/56* | (2006.01) |
| *C25B 1/04* | (2006.01) |
| *C25B 11/03* | (2006.01) |
| *B32B 43/00* | (2006.01) |
| *H01L 27/32* | (2006.01) |

(52) U.S. Cl.
CPC ........ *H01L 51/0097* (2013.01); *B32B 43/006* (2013.01); *C25B 1/04* (2013.01); *C25B 11/035* (2013.01); *H01L 21/6835* (2013.01); *H01L 51/003* (2013.01); *H01L 51/56* (2013.01); *H01L 27/3244* (2013.01); *H01L 2221/68345* (2013.01); *H01L 2221/68381* (2013.01); *H01L 2227/323* (2013.01); *H01L 2227/326* (2013.01); *H01L 2251/5338* (2013.01)

(58) Field of Classification Search
CPC ............... H01L 21/6835; H01L 51/003; H01L 51/0097; H01L 51/56; B32B 43/006; C25B 1/04; C25B 11/035
USPC .......................................... 438/703
See application file for complete search history.

(56) References Cited

U.S. PATENT DOCUMENTS

| | | | | |
|---|---|---|---|---|
| 4,988,674 A | * | 1/1991 | Mir ...................... | H01L 39/2422 427/62 |
| 2016/0039182 A1 | * | 2/2016 | Wang ....................... | B32B 9/04 428/336 |

* cited by examiner

*Primary Examiner* — Brook Kebede
(74) *Attorney, Agent, or Firm* — Leong C. Lei

(57) ABSTRACT

The present invention provides a stripping method of a flexible substrate, comprising: providing a porous metal substrate; forming a buffer layer on the porous metal substrate; forming a flexible substrate on the buffer layer; putting the flexible substrate in the electrolytic tank so that the part of the porous metal substrate is immersed in the electrolyte, and the porous metal substrate is employed to be a cathode electrified to electrolyze water in the electrolyte, and the porous metal substrate will releases the hydrogen, and the flexible substrate and the buffer layer are stripped from the porous metal substrate with the acting force of the hydrogen to obtain the flexible substrate with the buffer layer at the bottom. The method is high efficient and without damaging to promote the production yield of the flexible substrate.

16 Claims, 4 Drawing Sheets

STRIPPING METHOD OF FLEXIBLE SUBSTRATE

FIELD OF THE INVENTION

The present invention relates to a display technology field, and more particularly to a stripping method of a flexible substrate.

BACKGROUND OF THE INVENTION

With the constant update and the development of the technology, the bendable flexible element manufactured by utilizing the flexible substrate has the possibility to become the main stream apparatus of the next generation optical-electric element. For instance, the flexible element, such as the display, the chip, the circuit, the power source, the sensor and etc. can achieve the functions that the traditional optical-electric element cannot realize, and has better advantage in the cost and the user experience. The flexible display is illustrated, which is a method of manufacturing elements on the surface of the substrate which is constructed with flexible material, and the Active-matrix organic light emitting diode (AMOLED) can be illustrated. The flexible substrate needs to be manufactured or attached on the surface of the rigid substrate, and then the element manufacture is proceeded. Finally, the flexible substrate is stripped from the rigid substrate. Thus, how to effectively strip the flexible substrate from the rigid substrate is the key technology of production of the flexible element.

At present, the main stripping manner is to utilize the laser ablation. The high intensity laser is applied to the border of the polymer flexible substrate and the rigid glass substrate to ablate the polymer of the interlayer for achieving the stripping of the flexible substrate and the rigid substrate. Such manner can realize the mass production but the scan dimension of the laser directly restricts the mass production rate, and the generated heat energy can cause the larger damage to the flexible display film. Thus, it is difficult to be applied for the manufacture of the large scale flexible display. Significantly, the operation of the device of the laser ablation is complicated, and the apparatus is expensive and causes cost burden. For raising the yield of the product and reducing the cost, it is extremely urgent to develop the method which is mild and easy to operate and the cost thereof is cheap.

Many companies and the scientific research institutions in the display industry at present have proposed various solutions. For instance, LG utilizes chemical method to corrode the stainless steel substrate for achieving the stripping of the flexible substrate and the rigid substrate but the chemical solution corroding the stainless steel also has corrosion function to the flexible element, which leads to that the lifetime of the flexible display is greatly decreased. Samsung utilizes the resistor heating sense detachment skill, which detaches the substrate and the glass with the heating method. However, the over high temperature needs to add process for the protection to the light emitting element, and results in that the yield and the cost cannot be ensured. TCL (CSOT) utilizes a second rigid substrate embedded between the flexible substrate and the rigid substrate and ensures that the area of the second rigid substrate is smaller than those of the flexible substrate and the rigid substrate. Then, the cutting is implemented along the second rigid substrate, which gently and effectively to achieve the stripping of the flexible substrate and the rigid substrate. This method realizes the stripping of the flexible substrate and the rigid substrate but it still faces the same stripping issue while separating the flexible substrate and the second rigid substrate, which can easily cause the damage to the flexible substrate.

Therefore, there is a need to provide a stripping method of a flexible substrate to solve the aforesaid issue.

SUMMARY OF THE INVENTION

An objective of the present invention is to provide a stripping method of a flexible substrate, which is high efficient and without damaging to promote the production yield of the flexible substrate and to reduce the production cost.

For realizing the aforesaid objective, the present invention provides a stripping method of a flexible substrate, comprising steps of:

step 1, providing a porous metal substrate, and the porous metal substrate is a metal substrate comprising a plurality of holes inside, and a buffer layer is formed on the porous metal substrate;

step 2, forming a flexible substrate on the buffer layer;

step 3, providing an electrolytic device, and the electrolytic device comprises an electrolytic tank and an anode located in the electrolytic tank;

step 4, loading electrolyte in the electrolytic tank of the electrolytic device;

a multiple layer plate comprising the flexible substrate, the buffer layer and the porous metal substrate which is manufactured in the step 2 is put in the electrolytic tank in a manner that the porous metal substrate faces downward to make the porous metal substrate contact with the electrolyte, and the porous metal substrate is employed to be a cathode, and a power source is applied between the porous metal substrate and the anode to electrolyze water in the electrolyte, and the water near the porous metal substrate and in the holes inside the porous metal substrate is electrolyzed to generate hydrogen, and the hydrogen applies an acting force to the buffer layer to strip the buffer layer from the porous metal substrate to obtain the flexible substrate with the buffer layer at the bottom.

Material of the porous metal substrate is iron, nickel or copper.

Material of the buffer layer is a silicon oxide layer, a silicon nitride layer or a composite layer superimposed with the silicon oxide layer and the silicon nitride layer.

In the step 1, chemical vapor deposition is employed to form the buffer layer.

Material of the flexible substrate is organic polymer.

The organic polymer is polyimide.

The step 2 further comprises: manufacturing an element on the flexible substrate.

Material of the anode of the electrolytic device is carbon, platinum or gold.

In the step 4, one side of the porous metal substrate away from the flexible substrate is immersed in the electrolyte, and one side close to the flexible substrate is exposed outside the electrolyte.

In the step 4, the electrolyte is sulfuric acid solution, sodium hydroxide solution, sodium sulfate solution, potassium nitrate solution or water.

The present invention further provides a stripping method of a flexible substrate, comprising steps of:

step 1, providing a porous metal substrate, and the porous metal substrate is a metal substrate comprising a plurality of holes inside, and a buffer layer is formed on the porous metal substrate;

step 2, forming a flexible substrate on the buffer layer;

step 3, providing an electrolytic device, and the electrolytic device comprises an electrolytic tank and an anode located in the electrolytic tank;

step 4, loading electrolyte in the electrolytic tank of the electrolytic device;

a multiple layer plate comprising the flexible substrate, the buffer layer and the porous metal substrate which is manufactured in the step 2 is put in the electrolytic tank in a manner that the porous metal substrate faces downward to make the porous metal substrate contact with the electrolyte, and the porous metal substrate is employed to be a cathode, and a power source is applied between the porous metal substrate and the anode to electrolyze water in the electrolyte, and the water near the porous metal substrate and in the holes inside the porous metal substrate is electrolyzed to generate hydrogen, and the hydrogen applies an acting force to the buffer layer to strip the buffer layer from the porous metal substrate to obtain the flexible substrate with the buffer layer at the bottom;

wherein material of the porous metal substrate is iron, nickel or copper;

wherein material of the buffer layer is a silicon oxide layer, a silicon nitride layer or a composite layer superimposed with the silicon oxide layer and the silicon nitride layer;

wherein in the step 1, chemical vapor deposition is employed to form the buffer layer;

wherein material of the flexible substrate is organic polymer.

The benefits of the present invention are: the present invention provides a stripping method of a flexible substrate, comprising: providing a porous metal substrate; forming a buffer layer on the porous metal substrate; forming a flexible substrate on the buffer layer; putting the flexible substrate in the electrolytic tank so that the part of the porous metal substrate is immersed in the electrolyte, and the porous metal substrate is employed to be a cathode electrified to electrolyze water in the electrolyte, and the porous metal substrate will releases the hydrogen, and the flexible substrate and the buffer layer are stripped from the porous metal substrate with the acting force of the hydrogen to obtain the flexible substrate with the buffer layer at the bottom. The method is high efficient and without damaging to promote the production yield of the flexible substrate; the speed of stripping the flexible substrate is faster to ensure that the element on the flexible substrate will not be influenced in the stripping process; besides, the porous metal substrate can be repeatedly used to reduce the production cost.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
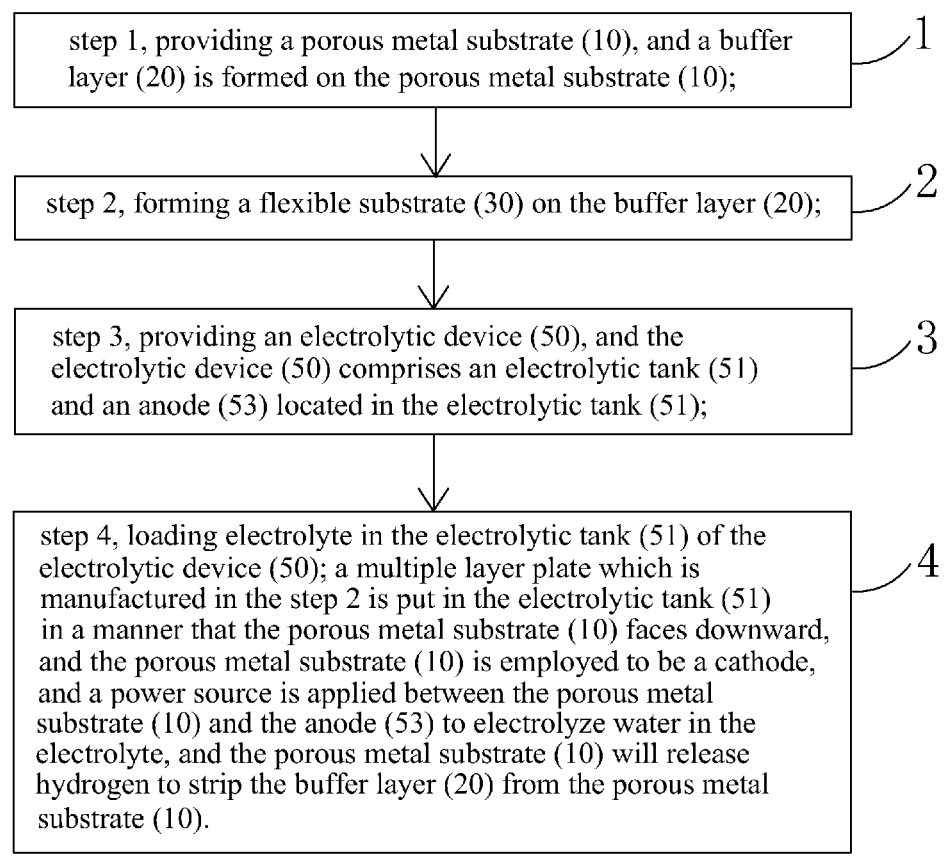
FIG. 1 is a flowchart of a stripping method of a flexible substrate according to the present invention.
Figure 2:
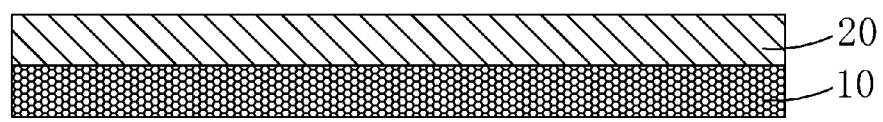
FIG. 2 is a diagram of the step 1 of a stripping method of a flexible substrate according to the present invention.

Please refer to FIG. 1. The present invention provides a stripping method of a flexible substrate, comprising steps of:

step 1, as shown in FIG. 2, providing a porous metal substrate 10, and the porous metal substrate 10 is a metal substrate comprising a plurality of holes inside, and a buffer layer 20 is formed on the porous metal substrate 10.

Specifically, material of the porous metal substrate 10 is iron (Fe), nickel (Ni) or copper (Cu).

Specifically, material of the buffer layer 20 is a silicon oxide layer (SiOx), a silicon nitride layer (SiNx) or a composite layer superimposed with the silicon oxide layer and the silicon nitride layer.

Specifically, in the step 1, chemical vapor deposition is employed to form the buffer layer 20.

Figure 3:
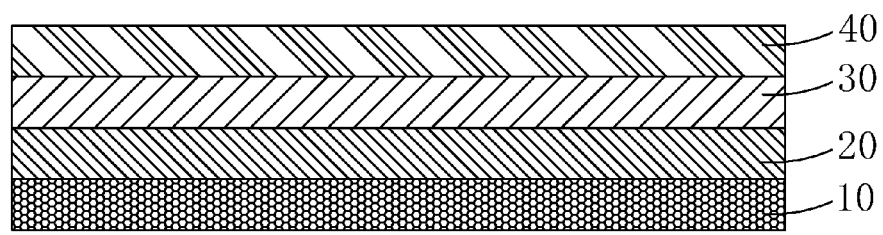
FIG. 3 is a diagram of the step 2 of a stripping method of a flexible substrate according to the present invention.

Specifically, in the step 1, with forming the buffer layer 20 on the porous metal substrate 10, it can prevent the porous metal substrate 10 in the post heat process to influence the planeness of the bottom of the flexible substrate.

step 2, as shown in FIG. 3, forming a flexible substrate 30 on the buffer layer 20.

Specifically, material of the flexible substrate 30 is organic polymer, such as polyim ide.

Furthermore, the step 2 further comprises: manufacturing an element 40 on the flexible substrate 30.

Figure 4:
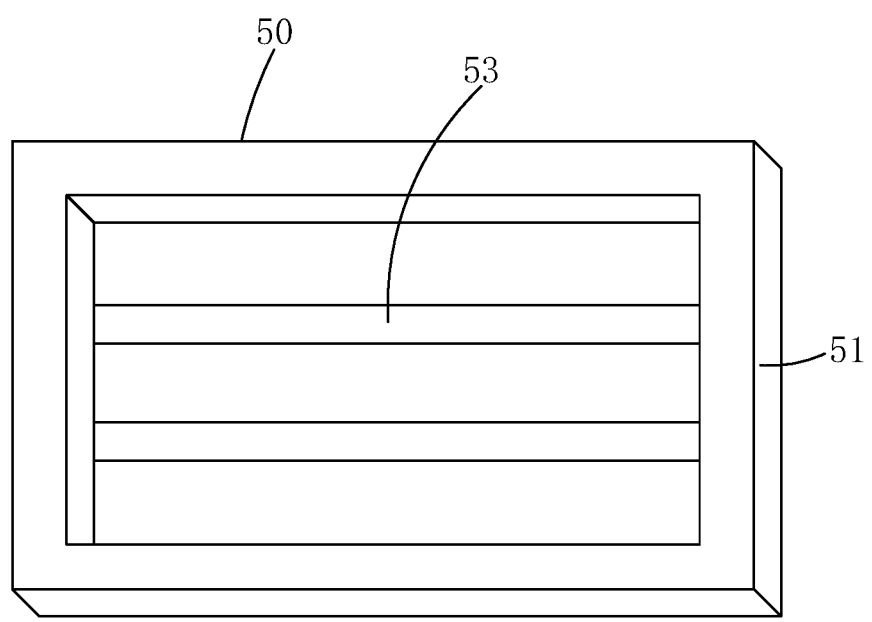
FIG. 4 is a diagram of the step 3 of a stripping method of a flexible substrate according to the present invention.

Specifically, the element 40 comprises the thin film transistor structure and the light emitting element structure in the normal OLED structure. The light emitting element structure comprises an electrode layer, a light emitting layer and etc. The internal structure of the element 40 in this embodiment belongs to the field of prior art. No specific description is repeated here.

step 3, as shown in FIG. 4, providing an electrolytic device 50, and the electrolytic device 50 comprises an electrolytic tank 51 and an anode 53 located in the electrolytic tank 51.

Figure 5:
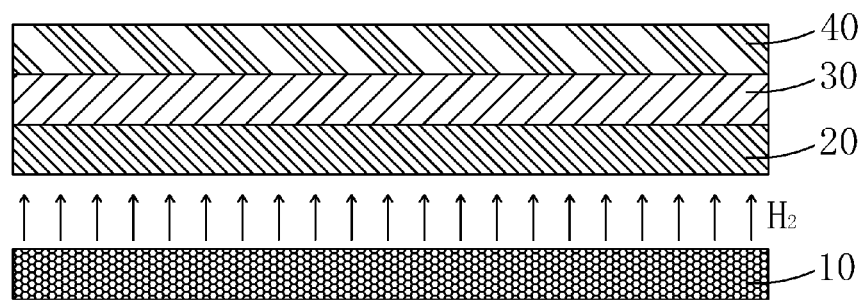
FIGS. 5-6 are diagrams of the step 4 of a stripping method of a flexible substrate according to the present invention.
Figure 6:
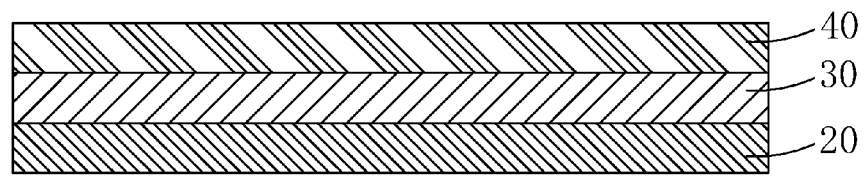

Specifically, material of the anode 53 can be metal oxide, the metal, of which the vivacity is worse than the porous metal substrate 10 or the carbon element; preferably, the material of the anode 53 is carbon (C), platinum (Pt) or gold (Au).

step 4, loading electrolyte in the electrolytic tank 51 of the electrolytic device 50;

a multiple layer plate comprising the flexible substrate 30, the buffer layer 20 and the porous metal substrate 10 which is manufactured in the step 2 is put in the electrolytic tank 51 in a manner that the porous metal substrate 10 faces downward to make the porous metal substrate 10 contact with the electrolyte, and the porous metal substrate 10 is employed to be a cathode, and a power source (not shown) is applied between the porous metal substrate 10 and the anode 53 to electrolyze water in the electrolyte, and the water near the porous metal substrate 10 and in the holes inside the porous metal substrate 10 is electrolyzed to generate hydrogen (H2), and the hydrogen applies an acting force to the buffer layer 20 to strip the buffer layer 20 from the porous metal substrate 10 (as shown in FIG. 5) to obtain the flexible substrate 30 with the buffer layer 20 (as shown in FIG. 6).

Specifically, in the step 4, one side of the porous metal substrate 10 away from the flexible substrate 30 is immersed in the electrolyte, and one side close to the flexible substrate 30 is exposed outside the electrolyte.

Specifically, in the step 4, the electrolyte is sulfuric acid solution, sodium hydroxide solution, sodium sulfate solution, potassium nitrate solution or water.

Specifically, in the step 4, the reaction of electrolyzing water is: $2H_2O = O_2\uparrow + 2H_2\uparrow$;

wherein the reaction of the cathode (i.e. the porous metal substrate 10) is $2H_2O + 2e^- = H_2\uparrow + 2OH^-$;

the reaction of the anode 53 is: $2H_2O - 4e^- = O_2\uparrow + 4H^+$.

In conclusion, the present invention provides a stripping method of a flexible substrate, comprising: providing a porous metal substrate; forming a buffer layer on the porous metal substrate; forming a flexible substrate on the buffer layer; putting the flexible substrate in the electrolytic tank so that the part of the porous metal substrate is immersed in the electrolyte, and the porous metal substrate is employed to be a cathode electrified to electrolyze water in the electrolyte, and the porous metal substrate will releases the hydrogen, and the flexible substrate and the buffer layer are stripped from the porous metal substrate with the acting force of the hydrogen to obtain the flexible substrate with the buffer layer at the bottom. The method is high efficient and without damaging to promote the production yield of the flexible substrate; the speed of stripping the flexible substrate is faster to ensure that the element on the flexible substrate will not be influenced in the stripping process; besides, the porous metal substrate can be repeatedly used to reduce the production cost.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A stripping method of a flexible substrate, comprising steps of:
   step 1, providing a porous metal substrate, and the porous metal substrate is a metal substrate comprising a plurality of holes inside, and a buffer layer is formed on the porous metal substrate;
   step 2, forming a flexible substrate on the buffer layer;
   step 3, providing an electrolytic device, and the electrolytic device comprises an electrolytic tank and an anode located in the electrolytic tank;
   step 4, loading electrolyte in the electrolytic tank of the electrolytic device;
   a multiple layer plate comprising the flexible substrate, the buffer layer and the porous metal substrate which is manufactured in the step 2 is put in the electrolytic tank in a manner that the porous metal substrate faces downward to make the porous metal substrate contact with the electrolyte, and the porous metal substrate is employed to be a cathode, and a power source is applied between the porous metal substrate and the anode to electrolyze water in the electrolyte, and the water near the porous metal substrate and in the holes inside the porous metal substrate is electrolyzed to generate hydrogen, and the hydrogen applies an acting force to the buffer layer to strip the buffer layer from the porous metal substrate to obtain the flexible substrate with the buffer layer at the bottom.

2. The stripping method of the flexible substrate according to claim 1, wherein material of the porous metal substrate is iron, nickel or copper.

3. The stripping method of the flexible substrate according to claim 1, wherein material of the buffer layer is a silicon oxide layer, a silicon nitride layer or a composite layer superimposed with the silicon oxide layer and the silicon nitride layer.

4. The stripping method of the flexible substrate according to claim 3, wherein in the step 1, chemical vapor deposition is employed to form the buffer layer.

5. The stripping method of the flexible substrate according to claim 1, wherein material of the flexible substrate is organic polymer.

6. The stripping method of the flexible substrate according to claim 5, wherein the organic polymer is polyimide.

7. The stripping method of the flexible substrate according to claim 1, wherein the step 2 further comprises: manufacturing an element on the flexible substrate.

8. The stripping method of the flexible substrate according to claim 1, wherein material of the anode of the electrolytic device is carbon, platinum or gold.

9. The stripping method of the flexible substrate according to claim 1, wherein in the step 4, one side of the porous metal substrate away from the flexible substrate is immersed in the electrolyte, and one side close to the flexible substrate is exposed outside the electrolyte.

10. The stripping method of the flexible substrate according to claim 1, wherein in the step 4, the electrolyte is sulfuric acid solution, sodium hydroxide solution, sodium sulfate solution, potassium nitrate solution or water.

11. A stripping method of a flexible substrate, comprising steps of:
   step 1, providing a porous metal substrate, and the porous metal substrate is a metal substrate comprising a plurality of holes inside, and a buffer layer is formed on the porous metal substrate;
   step 2, forming a flexible substrate on the buffer layer;
   step 3, providing an electrolytic device, and the electrolytic device comprises an electrolytic tank and an anode located in the electrolytic tank;
   step 4, loading electrolyte in the electrolytic tank of the electrolytic device;
   a multiple layer plate comprising the flexible substrate, the buffer layer and the porous metal substrate which is manufactured in the step 2 is put in the electrolytic tank in a manner that the porous metal substrate faces downward to make the porous metal substrate contact with the electrolyte, and the porous metal substrate is employed to be a cathode, and a power source is applied between the porous metal substrate and the anode to electrolyze water in the electrolyte, and the water near the porous metal substrate and in the holes inside the porous metal substrate is electrolyzed to generate hydrogen, and the hydrogen applies an acting force to the buffer layer to strip the buffer layer from the porous metal substrate to obtain the flexible substrate with the buffer layer at the bottom;
   wherein material of the porous metal substrate is iron, nickel or copper;
   wherein material of the buffer layer is a silicon oxide layer, a silicon nitride layer or a composite layer superimposed with the silicon oxide layer and the silicon nitride layer;

wherein in the step 1, chemical vapor deposition is employed to form the buffer layer;

wherein material of the flexible substrate is organic polymer.

12. The stripping method of the flexible substrate according to claim 11, wherein the organic polymer is polyimide.

13. The stripping method of the flexible substrate according to claim 11, wherein the step 2 further comprises: manufacturing an element on the flexible substrate.

14. The stripping method of the flexible substrate according to claim 11, wherein material of the anode of the electrolytic device is carbon, platinum or gold.

15. The stripping method of the flexible substrate according to claim 11, wherein in the step 4, one side of the porous metal substrate away from the flexible substrate is immersed in the electrolyte, and one side close to the flexible substrate is exposed outside the electrolyte.

16. The stripping method of the flexible substrate according to claim 11, wherein in the step 4, the electrolyte is sulfuric acid solution, sodium hydroxide solution, sodium sulfate solution, potassium nitrate solution or water.

* * * * *